United States Patent
Doshay et al.

(10) Patent No.: US 12,044,821 B2
(45) Date of Patent: Jul. 23, 2024

(54) APERTURES FOR FLAT OPTICAL DEVICES

(71) Applicant: Applied Materials, Inc., Santa Clara, CA (US)

(72) Inventors: Sage Toko Garrett Doshay, Saratoga, CA (US); Rutger Meyer Timmerman Thijssen, San Jose, CA (US); Ludovic Godet, Sunnyvale, CA (US); Chien-An Chen, San Jose, CA (US); Pinkesh Rohit Shah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/877,158

(22) Filed: May 18, 2020

(65) Prior Publication Data

US 2020/0386911 A1 Dec. 10, 2020

Related U.S. Application Data (60) Provisional application No. 62/857,327, filed on Jun. 5, 2019.

(51) Int. Cl.
*G03F 7/00* (2006.01)
*G02B 1/00* (2006.01)

(52) U.S. Cl.
CPC .......... *G02B 1/002* (2013.01); *G03F 7/0002* (2013.01)

(58) Field of Classification Search
CPC .............................. G03F 7/0002; G02B 1/002
See application file for complete search history.

(56) References Cited

U.S. PATENT DOCUMENTS

| | | | |
|---|---|---|---|
| 7,115,525 B2 * | 10/2006 | Abatchev | H01L 21/0332 438/689 |
| 8,715,516 B2 | 5/2014 | Sakamoto et al. | |
| 2002/0044345 A1 | 4/2002 | Seiji et al. | |

(Continued)

FOREIGN PATENT DOCUMENTS

TW 200741328 A 11/2007

OTHER PUBLICATIONS

International Search Report and Written Opinion for PCT/US2020/033428 dated Oct. 20, 2020.

(Continued)

*Primary Examiner* — Nathan H Empie
(74) *Attorney, Agent, or Firm* — Patterson + Sheridan, LLP (57) ABSTRACT

Embodiments described herein relate to methods for fabricating optical devices. The methods described herein enable the fabrication of one or more optical devices on a substrate with apertures surrounding each of the optical devices having a plurality of structures. One embodiment of the methods described herein includes disposing an aperture material layer on a surface of a substrate, disposing a structure material layer over the apertures and the surface of the substrate, disposing a hardmask over the apertures and the structure material layer, disposing a patterned photoresist over the hardmask, the patterned photoresist defining exposed hardmask portions, removing the exposed hardmask portions to expose structure portions of the structure material layer, and removing the structure portions to form a plurality of structures between the apertures over regions of the surface of the substrate.

10 Claims, 12 Drawing Sheets

(56) References Cited

U.S. PATENT DOCUMENTS

| | | | |
|---|---|---|---|
| 2002/0118906 A1* | 8/2002 | Onoe | G02B 6/122 |
| | | | 385/14 |
| 2003/0107127 A1* | 6/2003 | Murai | G02F 1/136204 |
| | | | 257/E27.111 |
| 2004/0190338 A1 | 9/2004 | Lee | |
| 2005/0123842 A1* | 6/2005 | Kim | G02F 1/133516 |
| | | | 430/7 |
| 2005/0233487 A1 | 10/2005 | Liu et al. | |
| 2009/0160070 A1* | 6/2009 | Yun | H01L 21/32139 |
| | | | 257/784 |
| 2011/0049591 A1* | 3/2011 | Nakatani | H10K 39/32 |
| | | | 257/E31.127 |
| 2012/0280345 A1* | 11/2012 | Zhu | G02B 6/1226 |
| | | | 257/E31.127 |
| 2012/0314991 A1 | 12/2012 | Kang et al. | |
| 2014/0190621 A1* | 7/2014 | Kawata | B23K 26/40 |
| | | | 156/155 |
| 2014/0241661 A1 | 8/2014 | Chen et al. | |
| 2016/0306256 A1* | 10/2016 | Sun | G02B 6/138 |
| 2018/0102442 A1* | 4/2018 | Wang | H01L 31/02327 |
| 2018/0231702 A1 | 8/2018 | Lin et al. | |
| 2019/0064532 A1* | 2/2019 | Riley, Jr. | G02B 6/428 |
| 2019/0086579 A1* | 3/2019 | Kim | G02B 5/1814 |
| 2019/0137777 A1 | 5/2019 | Yang et al. | |

OTHER PUBLICATIONS

Taiwan Office Action Issued to Application No. 109118434 on Mar. 2, 2021.
Supplemental European Search Report issued to Patent Application No. 20817990.3 on Oct. 4, 2023.
European Search Report issued to Patent Application No. 20817990.3 on Sep. 15, 2023.
European Search Report issued to Application No. 20817990.3 on Jun. 15, 2023.
Japanese Office Action issued to patent application No. 2021-572006 on Apr. 30, 2024.

* cited by examiner

APERTURES FOR FLAT OPTICAL DEVICES

CROSS-REFERENCE TO RELATED APPLICATIONS

This application claims priority to U.S. Provisional Patent Application Ser. No. 62/857,327, filed on Jun. 5, 2019, which herein is incorporated by reference.

BACKGROUND

Field

Embodiments of the present disclosure generally relate to optical devices. More specifically, embodiments described herein provide for the fabrication of one or more optical devices with apertures surrounding each of the optical devices.

Description of the Related Art

Optical systems may be used to manipulate the propagation of light by spatially varying structural parameters of the structures (e.g., shape, size, orientation). One example of optical devices is flat optical devices. Flat optical devices in the visible and near-infrared spectrum may require transparent substrates having structures, such as nanostructures, disposed thereon. However, processing transparent substrates to form optical devices is both complex and challenging as an emerging technology. For example, beams impinging one of the one or more optical devices of the optical system may be larger in diameter than or not perfectly aligned with the desired optical device. The stray light from the impinging beams larger in diameter than the optical device may degrade the functionality and efficiency of optical system and may optically interact with the substrate and undesired adjacent optical devices.

Accordingly, what is needed in the art methods enabling the fabrication of one or more optical devices on a substrate with apertures surrounding each of the optical devices.

SUMMARY

In one embodiment, a method is provided. The method includes disposing an aperture material layer on a surface of a substrate, patterning the aperture material layer to form apertures over regions of the surface of the substrate corresponding to one of a first space defined by adjacent optical devices and a second space defined by one of the adjacent optical devices and a periphery of the substrate, disposing a structure material layer over the apertures and the surface of the substrate, disposing a hardmask over the apertures and the structure material layer, disposing a patterned photoresist over the hardmask, the patterned photoresist defining exposed hardmask portions, removing the exposed hardmask portions to expose structure portions of the structure material layer, and removing the structure portions to form a plurality of structures between the apertures over regions of the surface of the substrate.

In another embodiment, a method is provided. The method includes disposing a structure material layer on a surface of a substrate, disposing an aperture material layer over the structure material layer, patterning the aperture material layer to form apertures over regions of the surface of the substrate corresponding to one of a first space defined by adjacent optical devices and a second space defined by one of the adjacent optical devices and a periphery of the substrate, disposing an organic planarization layer (OPL) over the apertures and the structure material layer, disposing a patterned photoresist over the OPL, the patterned photoresist defining exposed OPL portions, removing the exposed OPL portions to expose structure portions of the structure material layer, and removing the structure portions to form a plurality of structures between the apertures over regions of the surface of the substrate.

In yet another embodiment, a method is provided. The method includes disposing a structure material layer on a surface of a substrate, the structure material layer is disposed between regions of the surface of the substrate corresponding to one of a first space defined by adjacent optical devices and a second space defined by one of the adjacent optical devices and a periphery of the substrate, disposing a hardmask over the structure material layer, disposing a patterned photoresist over the hardmask, the patterned photoresist defining exposed hardmask portions, removing the exposed hardmask portions to expose structure portions of the structure material layer, removing the structure portions to form a plurality of structures between the regions of the surface of the substrate, and forming apertures over the regions.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to methods for fabricating optical devices, such as metasurfaces. The methods described herein enable the fabrication of one or more optical devices on a substrate with apertures surrounding each of the optical devices having a plurality of structures, such as nanostructures, formed on the substrate. One embodiment of the methods described herein includes disposing an aperture material layer on a surface of a substrate, disposing a structure material layer over the apertures and the surface of the substrate, disposing a hardmask over the apertures and the structure material layer, disposing a patterned photoresist over the hardmask, the patterned photoresist defining exposed hardmask portions, removing the exposed hardmask portions to expose structure portions of the structure material layer, and removing the structure portions to form a plurality of structures between the apertures over regions of the surface of the substrate.

Figure 1A:
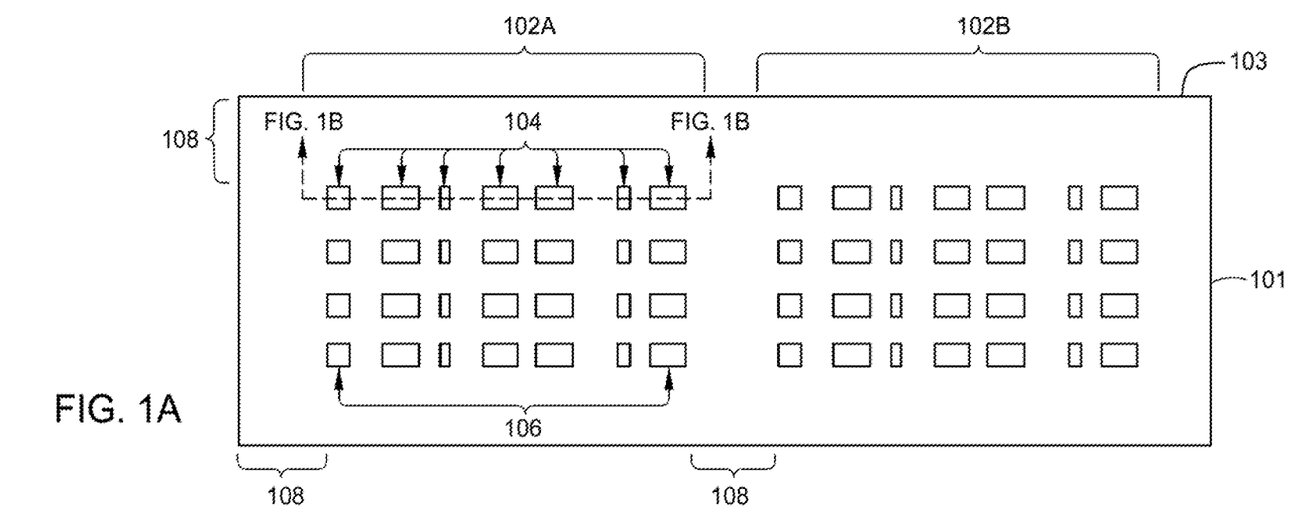
FIG. 1A is a top view of a substrate having one or more optical devices formed thereon according to an embodiment.
Figure 1B:
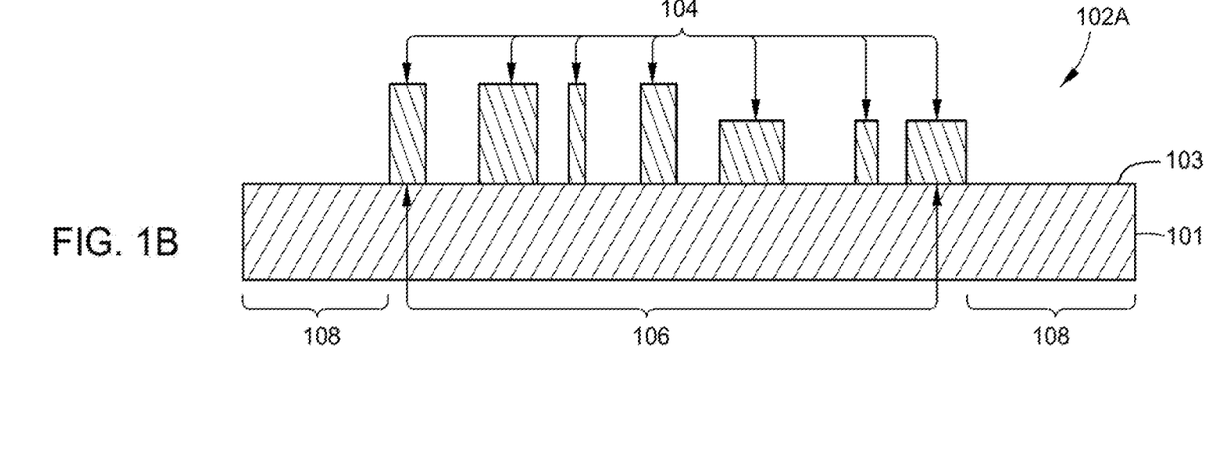
FIG. 1B is a cross-sectional view of the one of the optical devices according to an embodiment.

FIG. 1A is a top view of a substrate 101 having one or more optical devices 102a, 102b formed thereon. FIG. 1B is a cross-sectional view of the optical device 102a. Each of the optical devices 102a, 102b includes a plurality of structures 104 disposed on a substrate 101. In some embodiments, which can be combined with other embodiments described herein, the optical devices 102a, 102b are metasurfaces having the structures 104 that are nanostructures in the form of nanoscale features that are formed on (e.g. directly or indirectly on) or are integral with a surface 103 of substrate 101. Nanostructures can be substantially crystalline, monocrystalline, polycrystalline, amorphous or a combination thereof. In one example, each of the dimensions of the nanostructures has a dimension less than about 1000 nm, for example, less than about 500 nm, less than about 200 nm, less than about 100 nm or even less than about 20 nm. While FIGS. 1A and 1B show the structures 104 in a lattice arrangement, other arrangements are likely. The lattice arrangement is not intended to limit the scope of the disclosure provided herein.

The substrate 101 may also be selected to transmit a suitable amount of light of a desired wavelength or wavelength range, such as one or more wavelengths from about 100 to about 300 nanometers. Without limitation, in some embodiments, the substrate 101 is configured such that the substrate 101 transmits greater than or equal to about 50%, 60%, 70%, 80%, 90%, 95%, 99% an IR to UV region of the light spectrum. The substrate 101 may be formed from any suitable material, provided that the substrate 101 can adequately transmit light in a desired wavelength or wavelength range and can serve as an adequate support for the optical devices. In some embodiments, which can be combined with other embodiments described herein, the material of substrate 101 has a refractive index that is relatively low, as compared to the refractive index of the structures 104. Substrate selection may include substrates of any suitable material, including, but not limited to, amorphous dielectrics, non-amorphous dielectrics, crystalline dielectrics, silicon oxide, polymers, and combinations thereof. In some embodiments, which can be combined with other embodiments described herein, the substrate 101 includes a transparent material. In one embodiment, which can be combined with other embodiments described herein, the substrate 101 is transparent with an absorption coefficient smaller than 0.001. Suitable examples may include an oxide, sulfide, phosphide, telluride or combinations thereof. In one example, the substrate 101 includes silicon (Si), silicon dioxide ($SiO_2$), sapphire, and high-index transparent materials containing materials.

Each of the one or more optical devices 102a, 102b has one or more structures 104 formed on or are integral with a surface 103 of substrate 101. In one embodiment, which can be combined with other embodiments described herein, the structures 104 may have the same dimensions, such as height and width. In another embodiment, which can be combined with other embodiments described herein, at least one of the structures 104 may have at least one different dimension, such as one of height and width, from the dimensions of the additional structures 104. In one embodiment, which can be combined with other embodiments described herein, the structures 104 may have the same refractive index. In another embodiment, which can be combined with other embodiments described herein, at least one of the structures 104 may have a different refractive index than the refractive index of the additional structures 104.

In one embodiment, which can be combined with other embodiments described herein, the structure material, i.e., material of the structures 104, includes metal-containing dielectric materials not limited to titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), and zinc stannate (tin oxide) ($SnZnO_3$) containing materials. In another embodiment, which can be combined with other embodiments described herein, the structure material includes non-conductive non-crystalline materials, such as dielectric materials. The dielectric materials may include amorphous dielectrics, non-amorphous dielectrics, and crystalline dielectrics. Examples of the dielectric materials include, but are not limited to, a-Si containing materials, such as silicon nitride ($Si_3N_4$) and amorphous silicon (a-Si).

The methods of fabricating one or more optical devices 102a, 102b described herein include the formation of apertures 105, shown in FIGS. 3B-3F, FIGS. 5B-5E, FIGS. 7B-7G, and FIGS. 9E, 9H, 9I, 9L, and 9M, adjacent to each peripheral structure 106 of the structures 104. In the embodiments described herein, the apertures are disposed over regions 108 corresponding to one of a space defined by adjacent optical devices 102a, 102b and a space defined by one of the optical devices 102a, 102b and a periphery of the substrate 101. In some embodiments, which can be combined with other embodiments described herein, the apertures are opaque such that one or more wavelengths in the range of about 100 to about 3000 nanometers are not transmitted. The apertures prevent stray light (i.e., light of an impinging beam being greater than the surface area defined by each peripheral structure 106 of the structures 104) from degrading the functionality and efficiency of the optical devices 102a, 102b. The aperture material, i.e. material of the apertures, includes, but is not limited to, chromium (Cr), titanium nitride (TiN), a-Si, titanium (Ti), and aluminum (Al) containing materials.

Figure 2:
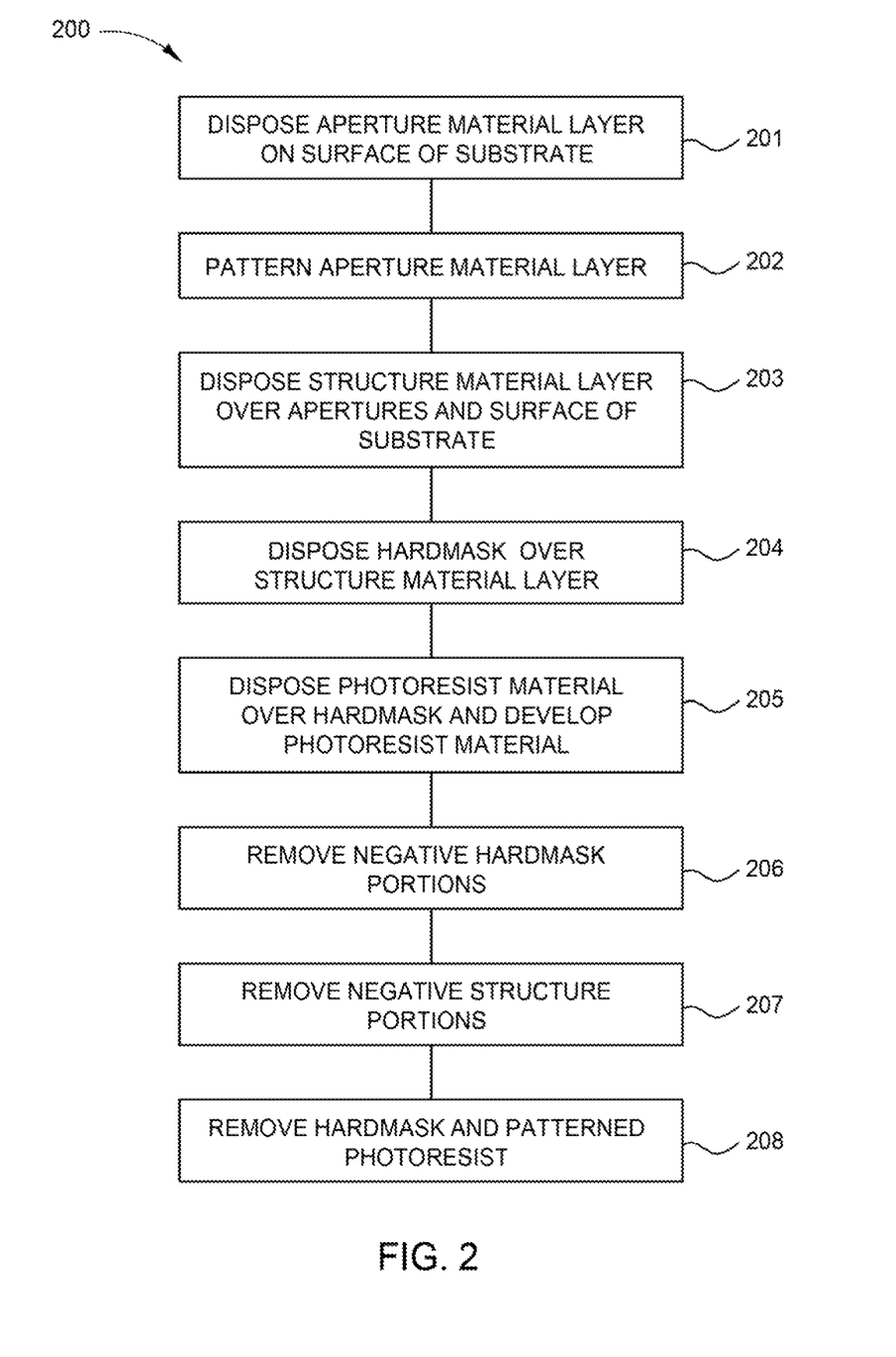
FIG. 2 is a flow diagram illustrating operations of a method for fabricating an optical device according to an embodiment.
Figure 3A:
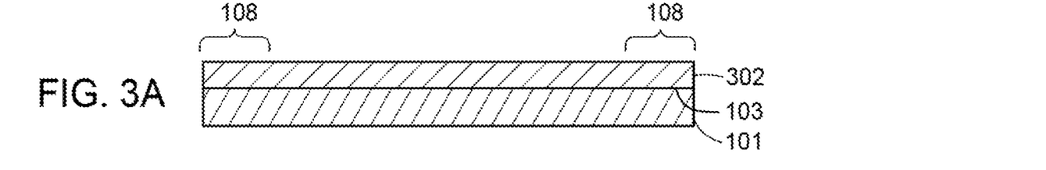
FIGS. 3A-3F are schematic, cross-sectional views of an optical device according to an embodiment.

FIG. 2 is a flow diagram illustrating operations of a method 200 for fabricating an optical device 300 as shown in FIGS. 3A-3F. At operation 201, as shown in FIG. 3A, an aperture material layer 302 is disposed on the surface 103 of the substrate 101. The aperture material layer 302 may be disposed on the surface 103 using a liquid material pour casting process, a spin-on coating process, a liquid spray coating process, a dry powder coating process, a screen printing process, a doctor blading process, a physical vapor deposition (PVD) process, a chemical vapor deposition (CVD) process, a plasma-enhanced (PECVD) process, a flowable CVD (FCVD) process, an atomic layer deposition (ALD) process, evaporation process, or sputtering process.

Figure 3B:
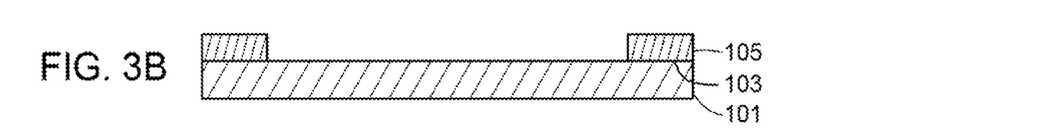

At operation 202, as shown in FIG. 3B, the aperture material layer 302 is patterned. Patterning the aperture material layer 302 forms apertures 105 over regions 108 corresponding to one of a space defined by adjacent optical devices 102a, 102b and a space defined by one of the optical devices 102a, 102b and a periphery of the substrate 101. Patterning the aperture material layer 302 may include a lithography process or etching process, such as ion implantation, ion etching, reactive ion etching (RIE), directional RIE, microblasting, waterjet cutting, laser etching, and selective wet chemical etching. The lithography process may include the utilization of alignment marks and/or features on the surface 103 of the substrate 101.

Figure 3C:
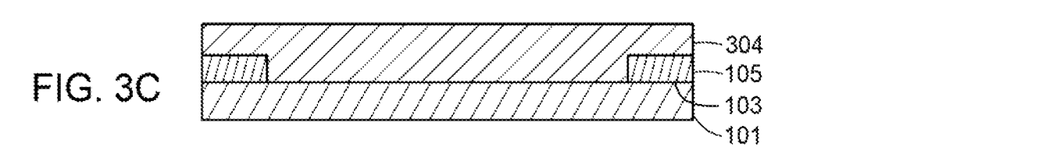

At operation 203, as shown in FIG. 3C, a structure material layer 304 is disposed over the apertures 105 and the surface 103 of the substrate 101. The structure material layer 304 may be disposed over the apertures 105 and the surface 103 using a liquid material pour casting process, a spin-on coating process, a liquid spray coating process, a dry powder coating process, a screen printing process, a doctor blading process, a PVD process, a CVD process, a PECVD process, a FCVD process, an ALD process, an evaporation process, or a sputtering process.

Figure 3D:
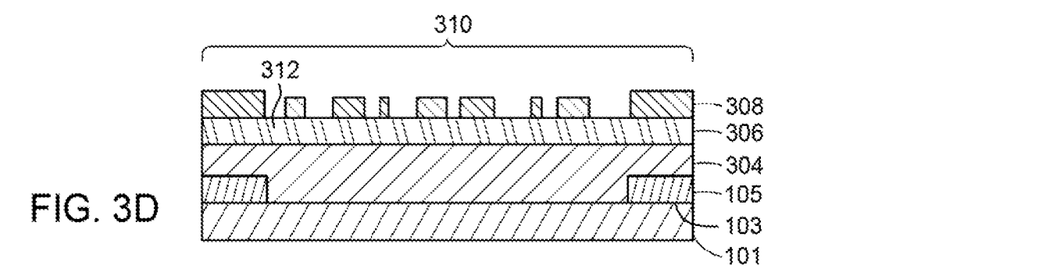

At operation 204, as shown in FIG. 3D, a hardmask 306 is disposed over the structure material layer 304. The hardmask 306 may be disposed over the structure material layer 304 using a liquid material pour casting process, a spin-on coating process, a liquid spray coating process, a dry powder coating process, a screen printing process, a doctor blading process, a PVD process, a CVD process, a PECVD process, a FCVD process, an ALD process, an evaporation process, or a sputtering process. In one embodiment, which can be combined with other embodiments described herein, the hardmask 306 is a non-transparent hardmask that is removed after the optical device 300 is formed. In another embodiment, the hardmask 306 is a transparent hardmask. The hardmask 306 includes, but is not limited to, chromium (Cr), silver (Ag), $Si_3N_4$, $SiO_2$, TiN, and carbon (C) containing materials.

At operation 205, as shown in FIG. 3D, a patterned photoresist 308 is disposed over the hardmask 306. The patterned photoresist 308 is formed by disposing a photoresist material on the hardmask 306 and performing a lithography process. The patterned photoresist 308 defines hardmask portions 312 of the hardmask 306 (i.e., openings of the hardmask 306). The hardmask portions 312 correspond to a structure pattern 310 to result in the formation of the structures 104. The patterned photoresist 308 may be disposed on the hardmask 306 using a spin-on coating process. The photoresist material 308 may include, but is not limited to, light-sensitive polymer containing materials.

Figure 3E:
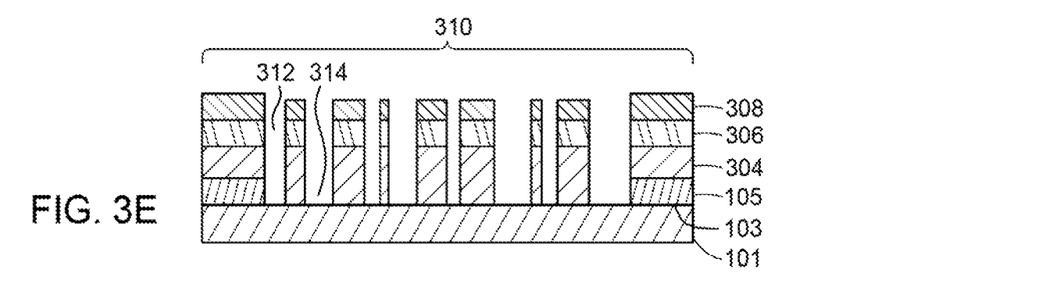

At operation 206, as shown in FIG. 3E, the hardmask portions 312 of the hardmask 306 are removed. Removing the hardmask portions 312 exposes negative structure portions 314 of the structure material layer 304. The negative structure portions 314 correspond to the structure pattern 310 to result in the formation of the structures 104. At operation 207, as shown in FIG. 3E, the negative structure portions 314 of the structure material layer 304 are removed to form the structures 104. In one embodiment, which can be combined with other embodiments described herein, the hardmask 306 has a lower etch rate than the structure material of the structure material layer 304. The hardmask portions 312 and negative structure portions 314 may be removed by ion etching, RIE, or selective wet chemical etching.

Figure 3F:
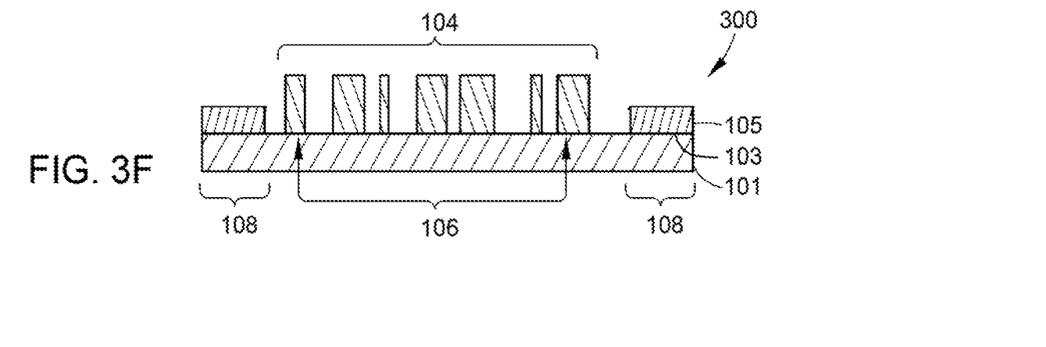

At operation 208, as shown in FIG. 3F, the hardmask 306 and the patterned photoresist 308 are removed. Removing the hardmask 306 may include ion etching, RIE, or selective wet chemical etching. Removing the patterned photoresist 308 may include a lithography process or etching process described herein. The method 200 forms the optical device 300 with apertures 105 disposed over regions 108 adjacent to each peripheral structure 106 of the structures 104.

Figure 4:
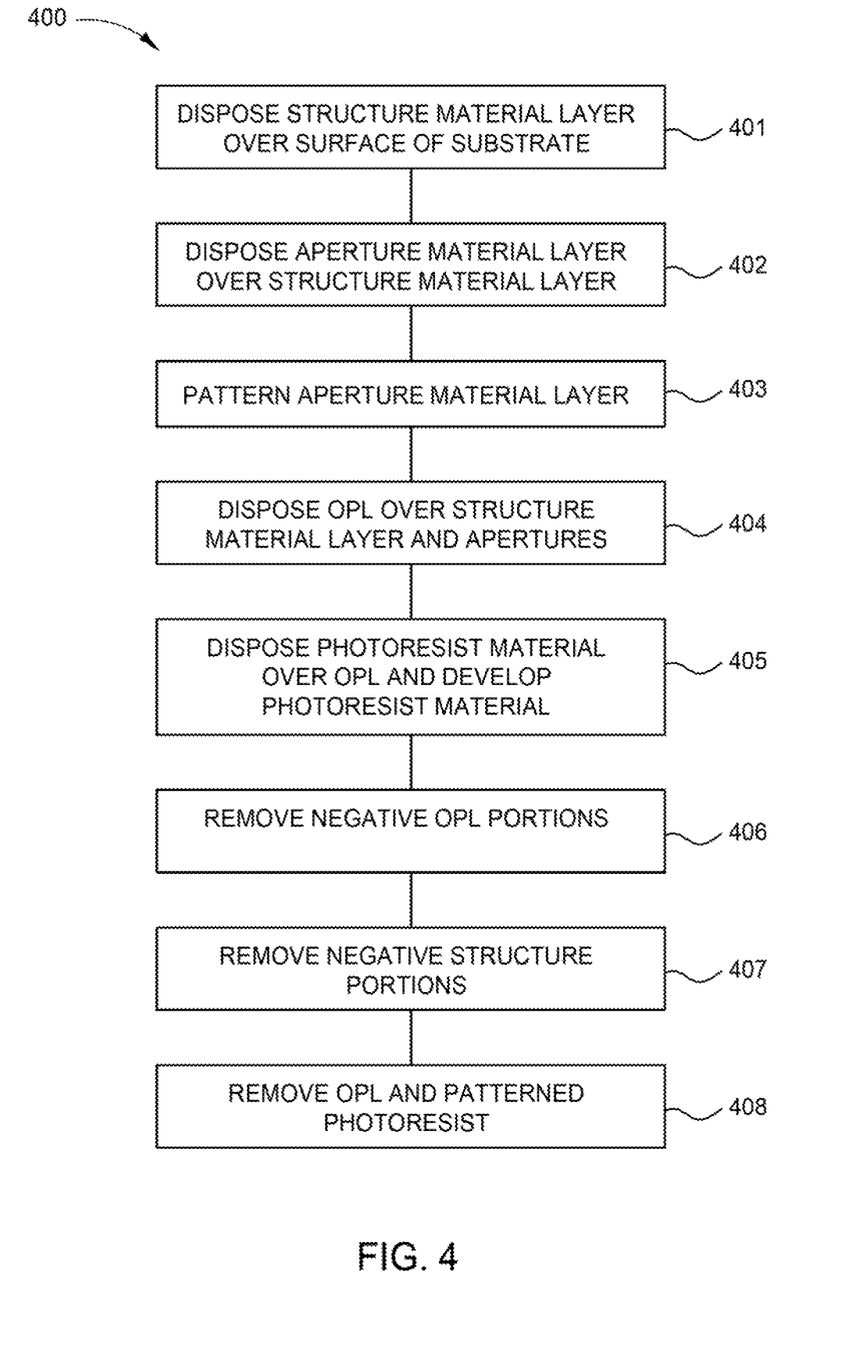
FIG. 4 is a flow diagram illustrating operations of a method for fabricating an optical device according to an embodiment.
Figure 5A:
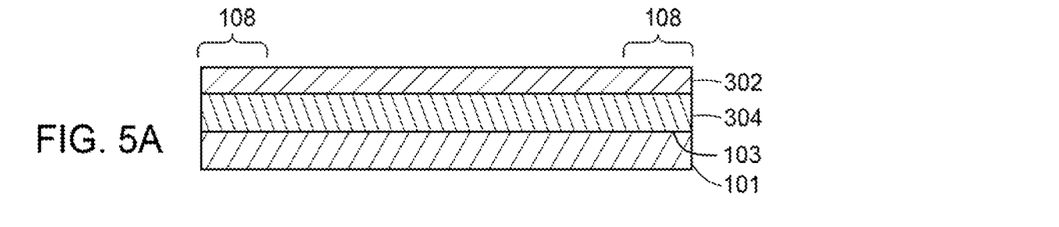
FIGS. 5A-5E are schematic, cross-sectional views an optical device according to an embodiment.
Figure 5B:
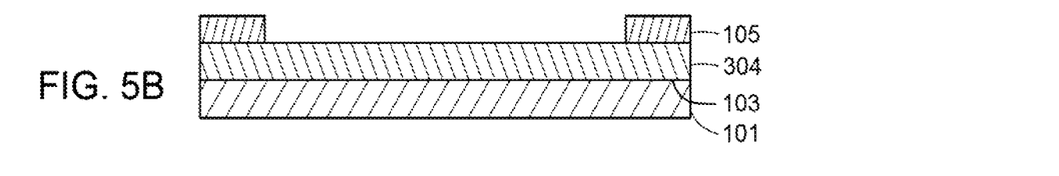

FIG. 4 is a flow diagram illustrating operations of a method 400 for fabricating an optical device 500 as shown in FIGS. 5A-5E. At operation 401, as shown in FIG. 5A, a structure material layer 304 is disposed over the surface 103 of the substrate 101. The structure material layer 304 may be disposed over the surface 103 of the substrate 101 using one or more of the processes provided in operation 203 of the method 200. At operation 402, as shown in FIG. 5A, an aperture material layer 302 is disposed over the surface 103 of the substrate 101. The aperture material layer 302 may be disposed over the structure material layer 304 using one or more of the processes provided in operation 201 of the method 200. At operation 403, as shown in FIG. 5B, the aperture material layer 302 is patterned. Patterning the aperture material layer 302 forms apertures 105 over regions 108 corresponding to one of a space defined by adjacent optical devices 102a, 102b and a space defined by one of the optical devices 102a, 102b and a periphery of the substrate 101. Patterning the aperture material layer 302 may include one or more of the processes provided in operation 202 of the method 200.

Figure 5C:
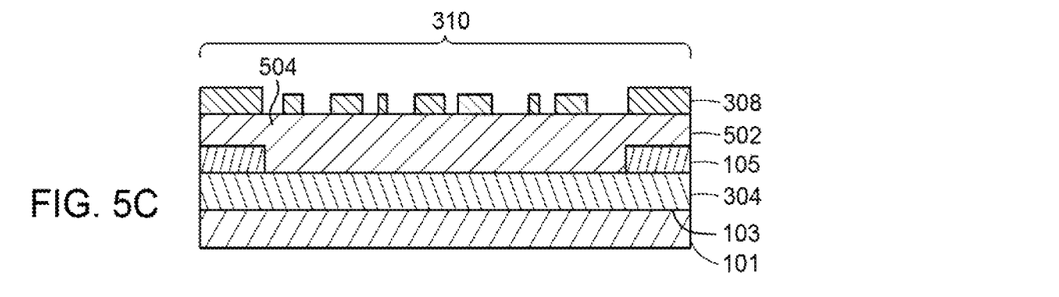

At operation 404, as shown in FIG. 5C, an organic planarization layer (OPL) 502 is disposed over the structure material layer 304 and the apertures 105. The OPL 502 may include a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 502 may include any organic polymer and a photo-active compound having a molecular structure that can attach to the molecular structure of the organic polymer. The OPL 502 may be disposed using a spin-on coating process.

At operation 405, as shown in FIG. 5C, a patterned photoresist 308 is disposed over the OPL 502. The patterned photoresist 308 is formed by disposing a photoresist material on the OPL 502 and performing a lithography process. The patterned photoresist 308 defines OPL portions 504 (i.e., openings of the OPL 502) of the OPL 502. The OPL portions 504 correspond to a structure pattern 310 to result in the formation of the structures 104. The patterned photoresist 308 may be disposed on the OPL 502 using a spin-on coating process. The patterned photoresist 308 may include, but is not limited to, light-sensitive polymer containing materials.

Figure 5D:
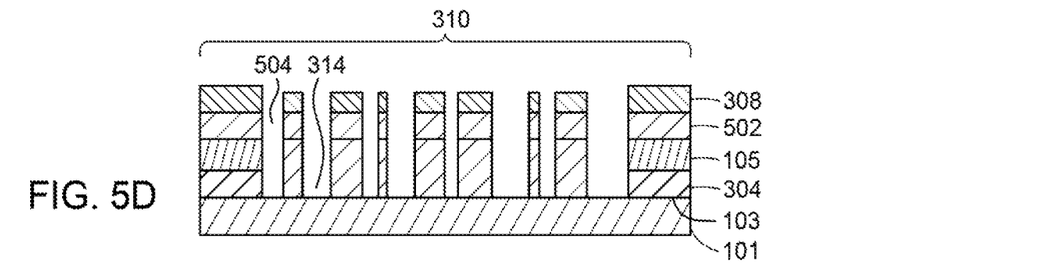

At operation 406, as shown in FIG. 5D, the OPL portions 504 of the OPL 502 are removed. Removing the OPL portions 504 exposes negative structure portions 314 of the structure material layer 304. The negative structure portions 314 correspond to the structure pattern 310 to result in the formation of the structures 104. The OPL portions 504 may be removed by RIE, wet etching, and lithography. At operation 407, as shown in FIG. 5D, the negative structure portions 314 of the structure material layer 304 are removed to form the structures 104. The negative structure portions 314 may be removed by ion etching, RIE, or selective wet chemical etching.

Figure 5E:
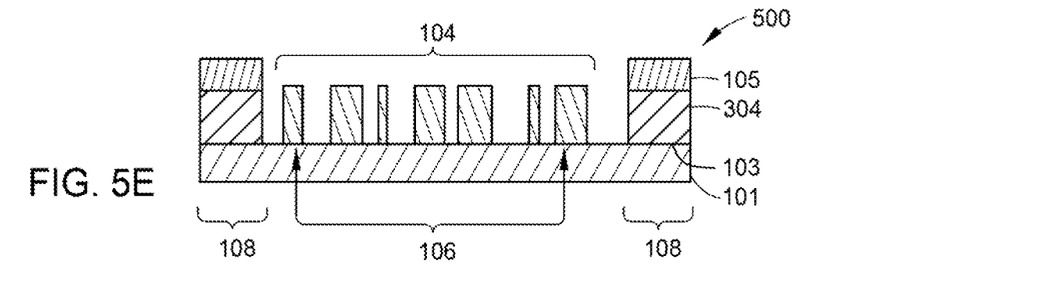

At operation 408, as shown in FIG. 5E, the OPL 502 and the patterned photoresist 308 are removed. Removing the patterned photoresist 308 may include a lithography process or etching process described herein. The method 200 forms the optical device 500 with apertures 105 disposed over regions 108 adjacent to each peripheral structure 106 of the structures 104.

Figure 6:
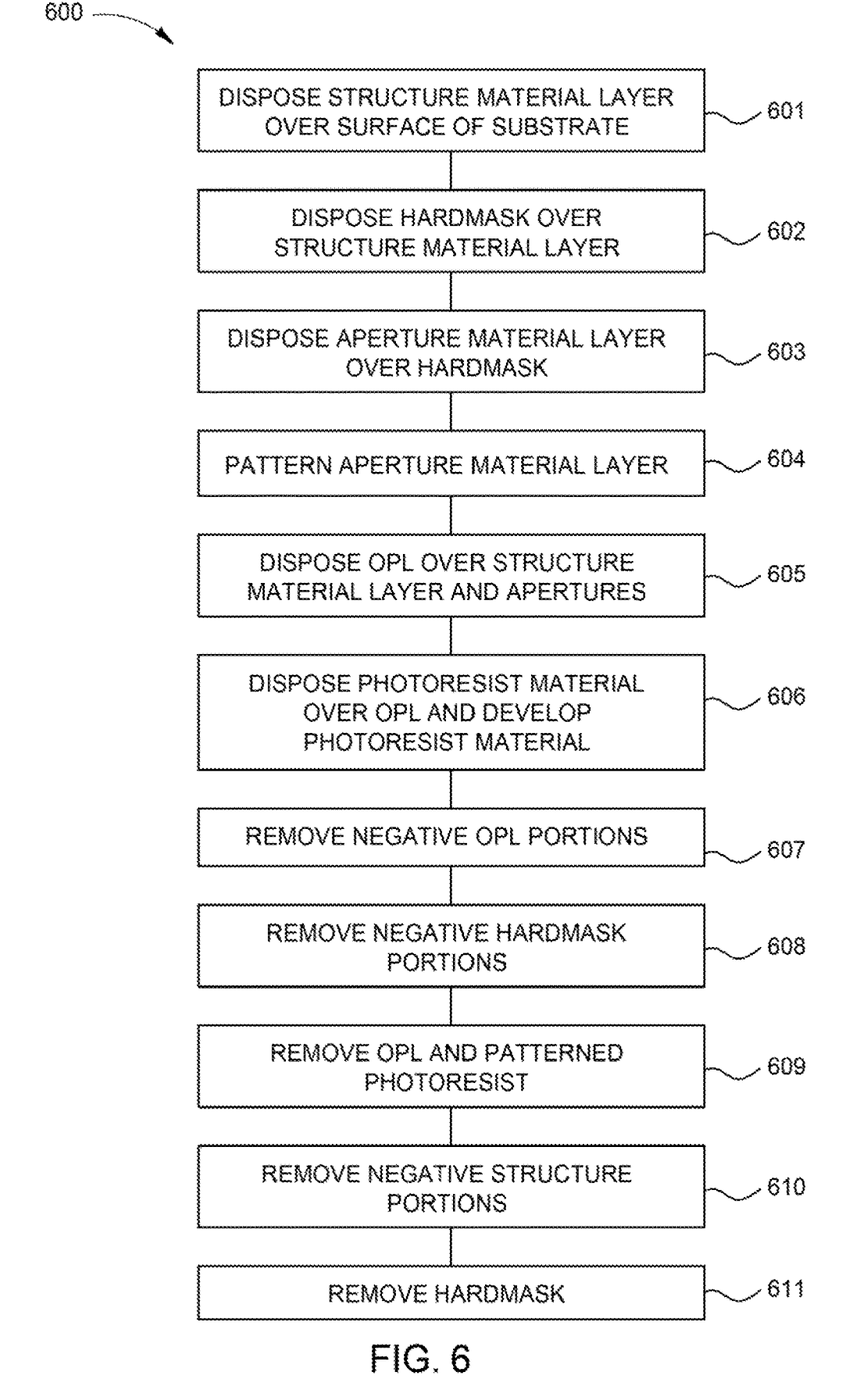
FIG. 6 is a flow diagram illustrating operations of a method for fabricating an optical device according to an embodiment.
Figure 7A:
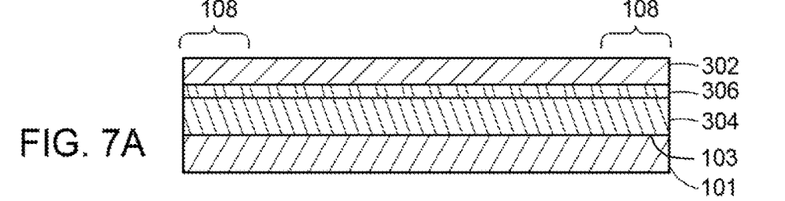
FIGS. 7A-7G are schematic, cross-sectional views of an optical device according to an embodiment.

FIG. 6 is a flow diagram illustrating operations of a method 600 for fabricating an optical device 700 as shown in FIGS. 7A-7G. At operation 601, as shown in FIG. 6A, a structure material layer 304 is disposed over the surface 103 of the substrate 101. The structure material layer 304 may be disposed over the surface 103 of the substrate 101 using one or more of the processes provided in operation 203 of the method 200. At operation 602, as shown in FIG. 7A, a hardmask 306 is disposed over the structure material layer 304. The hardmask 306 may be disposed over the structure material layer 304 using one or more of the processes provided in operation 204 of the method 200.

Figure 7B:
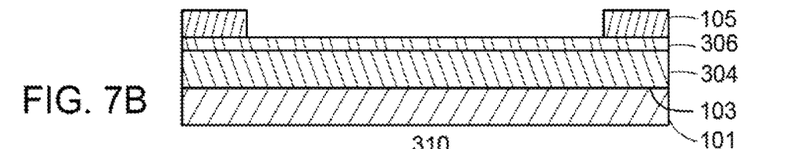

At operation 603, as shown in FIG. 7A, an aperture material layer 302 is disposed over the hardmask 306. The aperture material layer 302 may be disposed over the hardmask 306 using one or more of the processes provided in operation 201 of the method 200. In one embodiment, which can be combined with other embodiments described herein, the structure material layer 304 is an a-Si containing layer having a thickness of about 450 nm to about 1000 nm, the hardmask 306 is an $Si_3N_4$ containing layer having a thickness of about 10 nm to about 150 nm, and the aperture material layer 302 is a Cr containing layer having a thickness of about 10 nm to about 200 nm. At operation 604, as shown in FIG. 7B, the aperture material layer 302 is patterned. Patterning the aperture material layer 302 forms apertures 105 over regions 108 corresponding to one of a space defined by adjacent optical devices 102a, 102b and a space defined by one of the optical devices 102a, 102b and a periphery of the substrate 101. Patterning the aperture material layer 302 may include one or more of the processes provided in operation 202 of the method 200.

Figure 7C:
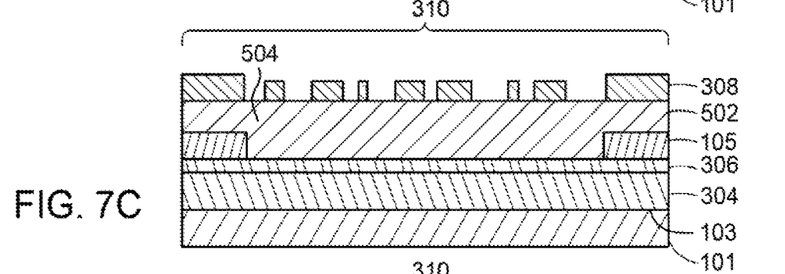
Figure 7D:
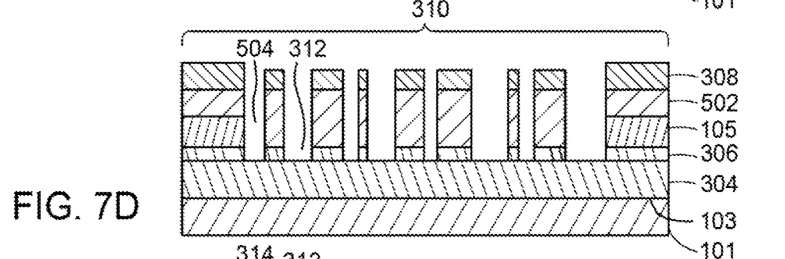

At operation 605, as shown in FIG. 7C, an OPL 502 is disposed over the hardmask 306 and the apertures 105. At operation 606, as shown in FIG. 7D, a patterned photoresist 308 is disposed over the OPL 502. The patterned photoresist 308 is formed by disposing a photoresist material on the OPL 502 and performing a lithography process. The patterned photoresist 308 defines OPL portions 504 of the OPL 502. The OPL portions 504 correspond to a structure pattern 310 to result in the formation of the structures 104.

Figure 7E:
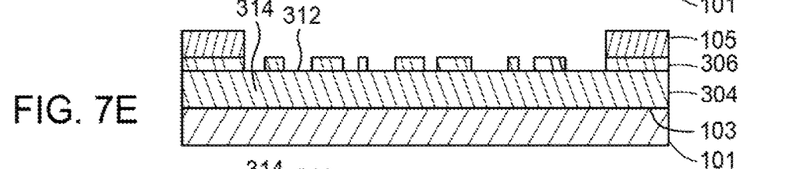

At operation 607, as shown in FIG. 7D, the OPL portions 504 of the OPL 502 are removed. Removing the OPL portions 504 exposes hardmask portions 312 of the hardmask 306. At operation 608, as shown in FIG. 7D, the hardmask portions 312 of the hardmask 306 are removed. Removing the hardmask portions 312 exposes negative structure portions 314 of the structure material layer 304. The negative structure portions 314 correspond to the structure pattern 310 to result in the formation of the structures 104. At operation 609, as shown in FIG. 7E, the OPL 502 and the patterned photoresist 308 are removed. Removing the patterned photoresist 308 may include a lithography process or etching process described herein.

Figure 7F:
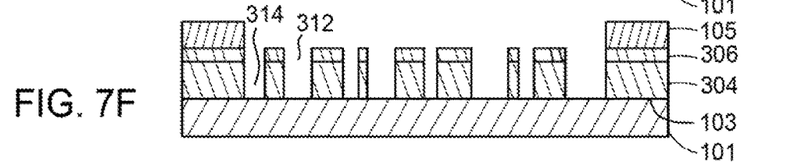
Figure 7G:
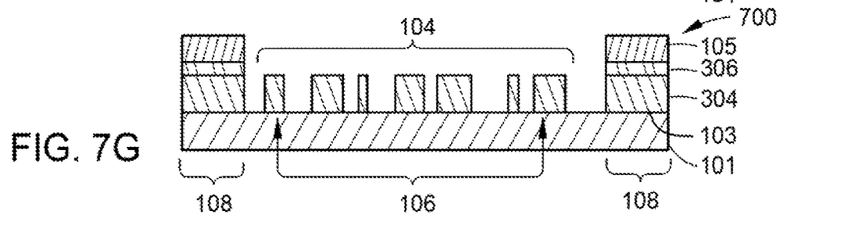

At operation 610, as shown in FIG. 7F, the negative structure portions 314 of the structure material layer 304 are removed to form the structures 104. At operation 611, as shown in FIG. 7G, the hardmask 306 is removed. Removing the hardmask 306 may include using one or more of the processes provided in operation 204 of the method 200. The method 200 forms the optical device 700 with apertures 105 disposed over regions 108 adjacent to each peripheral structure 106 of the structures 104.

Figure 8A:
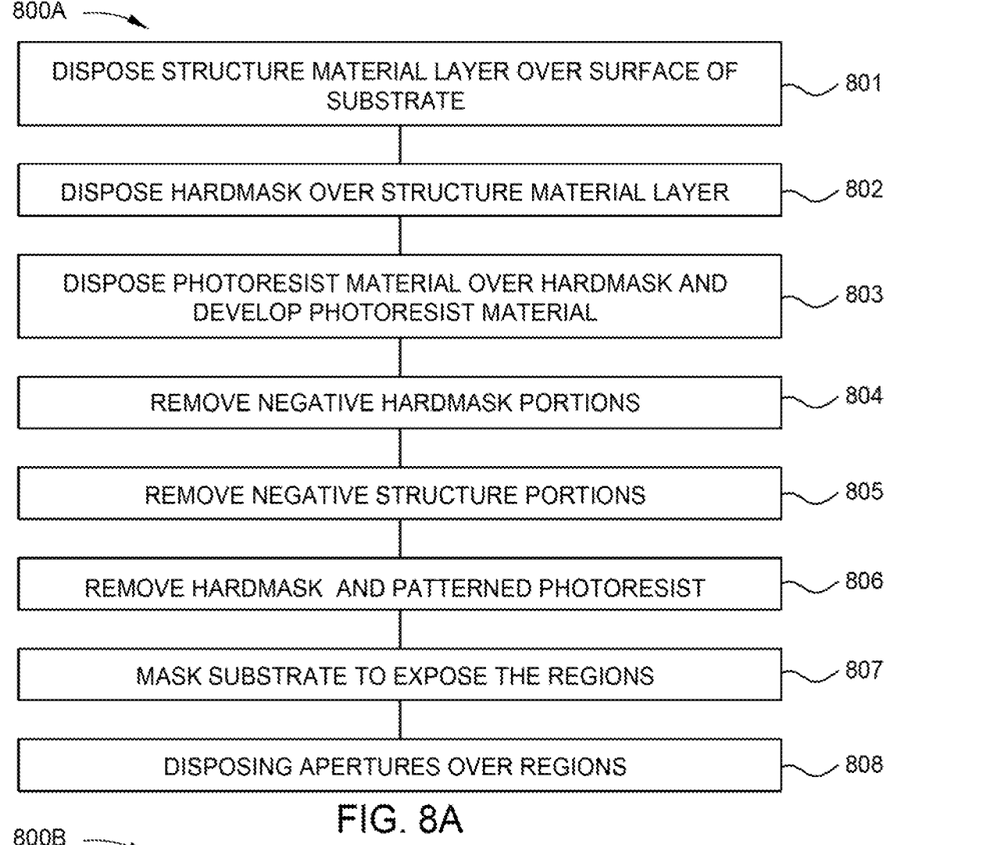
FIGS. 8A-8C are flow diagrams illustrating operations of methods for fabricating an optical device according to an embodiment.
Figure 9A:
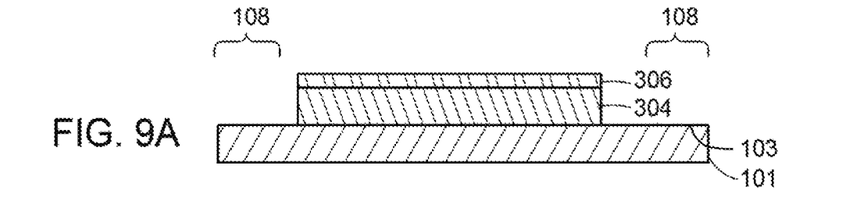
FIGS. 9A-9M are schematic, cross-sectional views an optical device according to an embodiment.
Figure 9B:
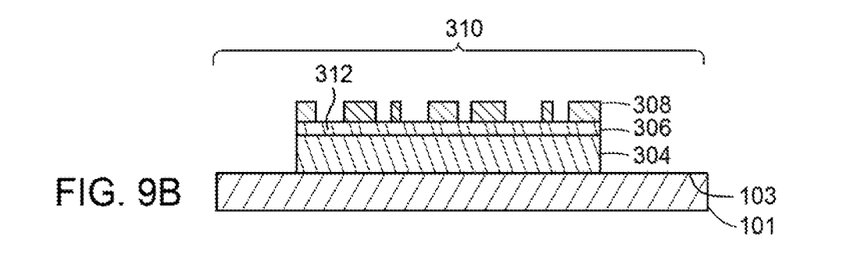

FIG. 8A is a flow diagram illustrating operations of a method 800A for fabricating an optical device 900A as shown in FIGS. 9A-9E. At operation 801, as shown in FIG. 9A, a structure material layer 304 is disposed over the surface 103 of the substrate 101. The structure material layer 304 may be disposed over the surface 103 of the substrate 101 using one or more of the processes provided in operation 203 of the method 200.

Figure 9C:
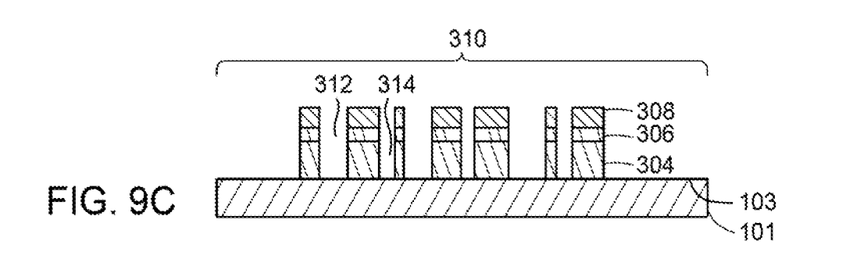

At operation 802, as shown in FIG. 9A, a hardmask 306 is disposed over the structure material layer 304. The hardmask 306 may be disposed over the structure material layer 304 using one or more of the processes provided in operation 204 of the method 200. At operation 803, as shown in FIG. 9C, a patterned photoresist 308 is disposed over the hardmask 306. The patterned photoresist 308 is formed by disposing a photoresist material on the hardmask 306 and performing a lithography process. The patterned photoresist 308 defines hardmask portions 312 of the hardmask 306. The hardmask portions 312 correspond to a structure pattern 310 to result in the formation of the structures 104.

Figure 9D:
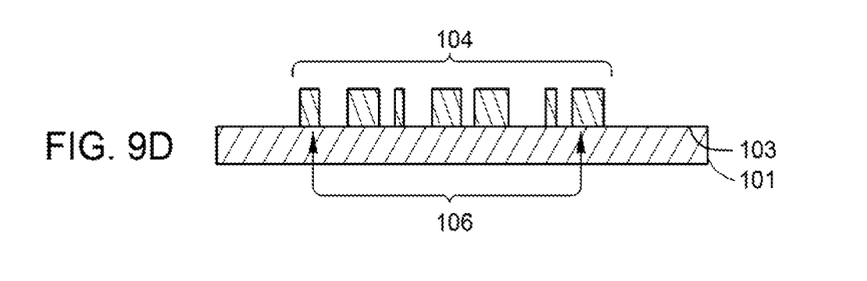
Figure 9E:
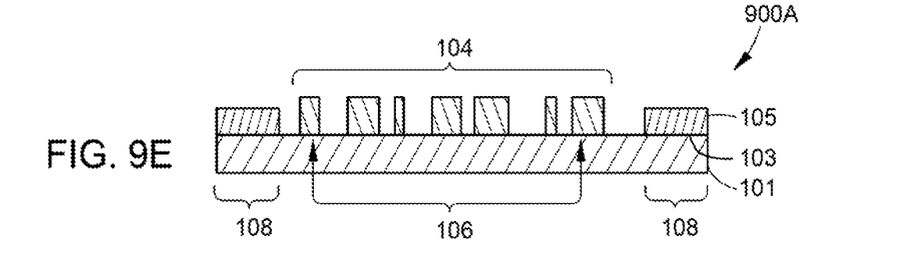

At operation 804, as shown in FIG. 9D, the hardmask portions 312 of the hardmask 306 are removed. At operation 805, as shown in FIG. 9D, the negative structure portions 314 of the structure material layer 304 are removed to form the structures 104. At operation 806, as shown in FIG. 9E, the hardmask 306 and the patterned photoresist 308 are removed.

At operation 807, the substrate 101 is masked to expose regions 108 adjacent to each peripheral structure 106 of the structures 104. Masking the substrate 101 may include placing a shadow mask over the structures 104 to expose the regions 108. At operation 808, as shown in FIG. 9F, apertures 105 are disposed over regions 108 adjacent to each peripheral structure 106 of the structures 104.

Figure 8B:
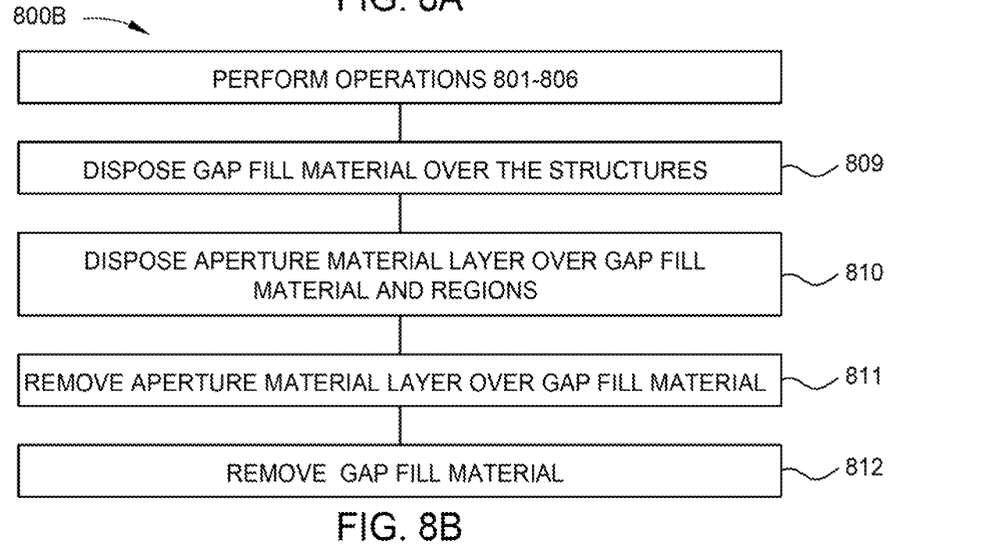
Figure 9F:
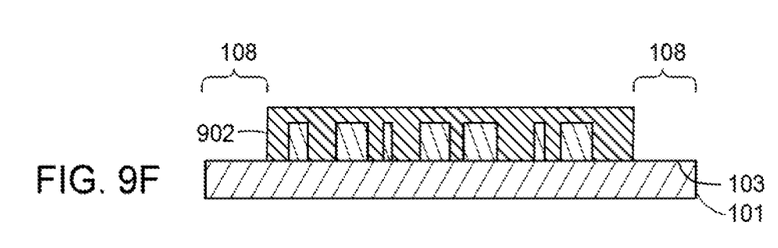
Figure 9G:
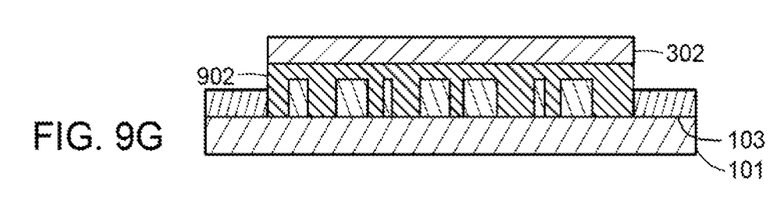
Figure 9H:
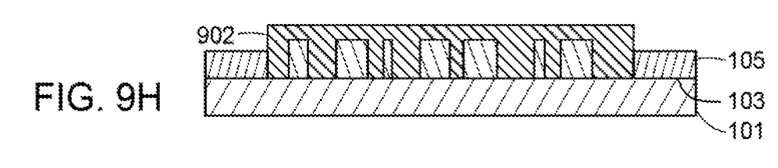
Figure 9I:
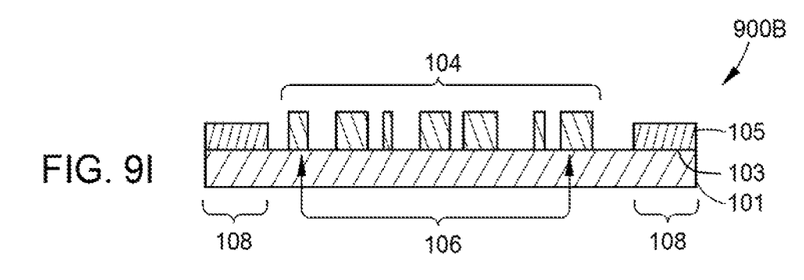

FIG. 8B is a flow diagram illustrating operations of a method 800B for fabricating an optical device 900B as shown in FIGS. 9A-9D, and FIGS. 9F-9I. The method 800B includes operations 801-806. At operation 809, as shown in FIG. 9F, a gap fill material 902 is disposed over the over the structures 104. The gap fill material 902 includes, but is not limited to, polymer, OPL, and spin-on containing materials. At operation 810, as shown in FIG. 9G, an aperture material layer 302 is disposed over the gap fill material 902 and regions 108. The aperture material layer 302 may be disposed over the gap fill material 902 and the regions 108 using one or more of the processes provided in operation 201 of the method 200. At operation 811, as shown in FIG. 9H, the aperture material layer 302 over the gap fill material 902 is removed to form apertures 105 over regions 108. At operation 812, as shown in FIG. 9I, the gap fill material 902 is removed. The gap fill material 902 may be removed by a solvent, wet etching, ashing, and RIE. The methods 800A and 800B forms the optical device 900A, 900B with apertures 105 disposed over regions 108 adjacent to each peripheral structure 106 of the structures 104.

Figure 8C:
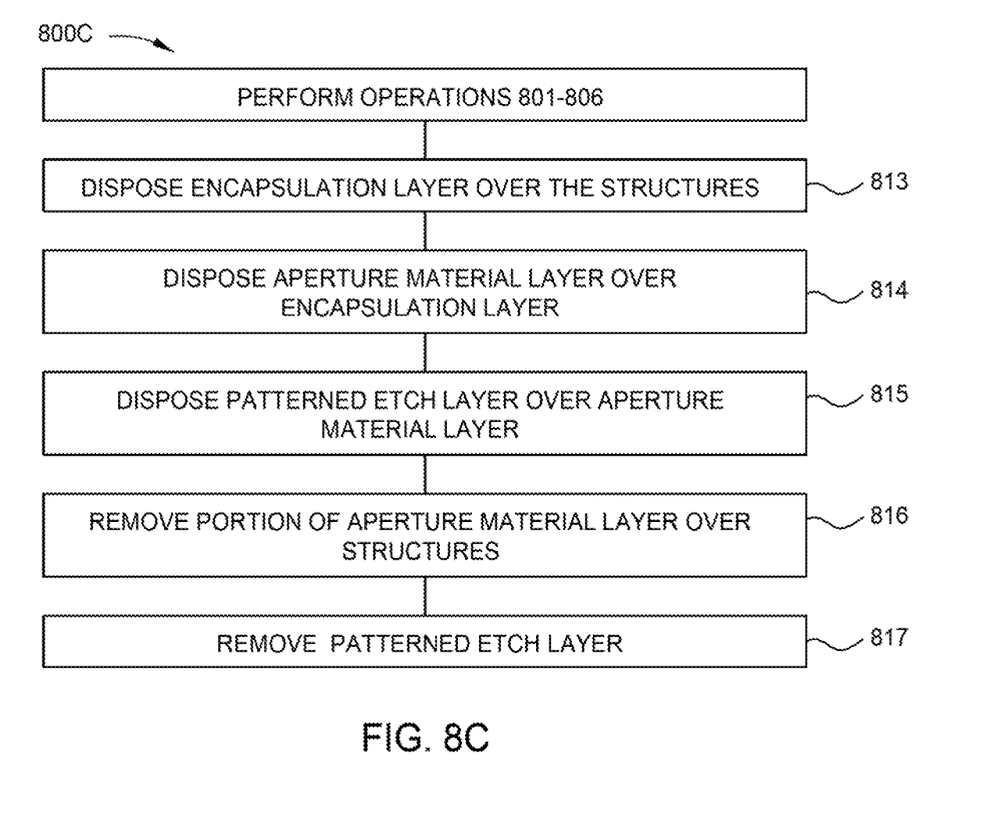
Figure 9J:
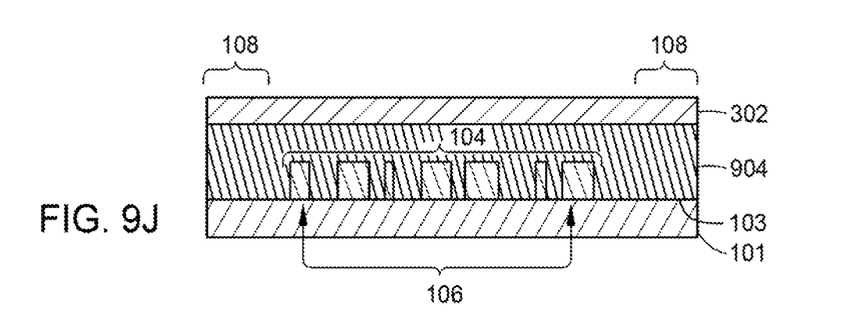
Figure 9K:
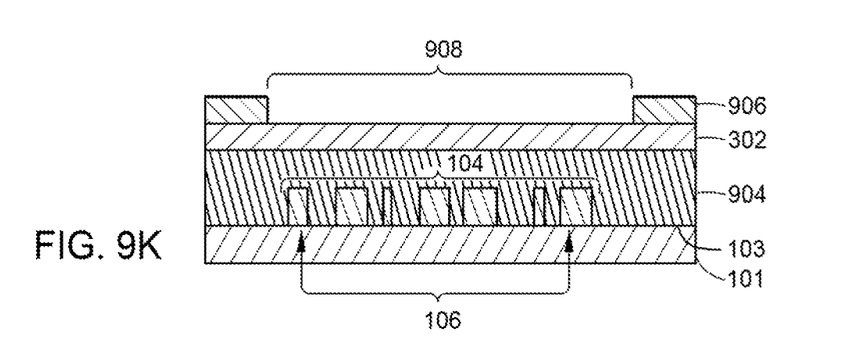
Figure 9L:
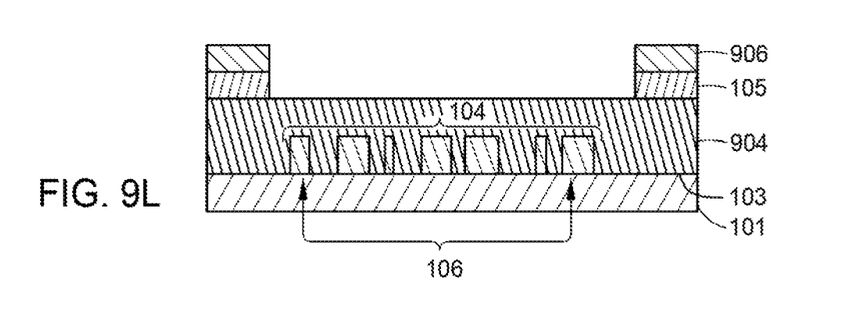
Figure 9M:
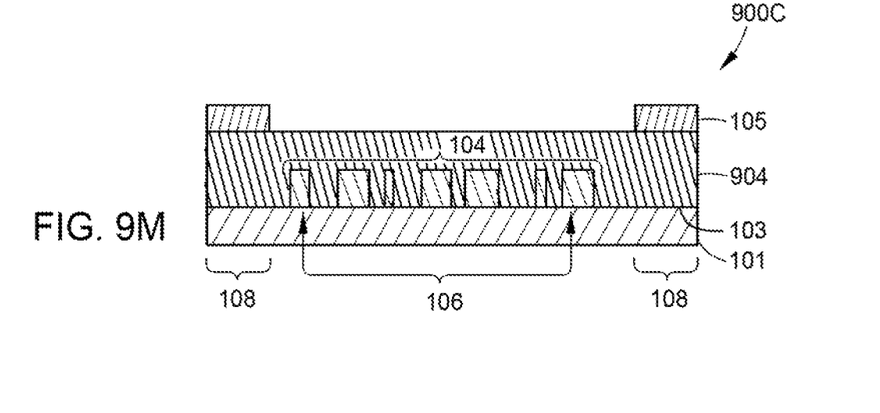

FIG. 8C is a flow diagram illustrating operations of a method 800C for fabricating an optical device 900C as shown in FIGS. 9A-9D, and FIGS. 9J-9N. The method 800C includes operations 801-806. At operation 813, as shown in FIG. 9J, an encapsulation layer 904 is disposed over the over the structures 104 and region 108. The encapsulation layer 904 includes, but is not limited to, $Si_3N_4$, $SiO_2$, low-index fluoropolymers, hydrogels, and photoresist containing materials. The encapsulation layer 904 may be disposed by one or more of PVD, CVD, FCVD, and spin-on coating. At operation 814, as shown in FIG. 9K, an aperture material layer 302 is disposed over the encapsulation layer 904. The aperture material layer 302 may be disposed over the encapsulation layer 904 using one or more of the processes provided in operation 201 of the method 200. At operation 815, as shown in FIG. 9L, a patterned etch layer 906 is disposed over the aperture material layer 302 corresponding to the regions 108 and exposes a portion 908 of the aperture material layer 302 over the structures 104. At operation 816, as shown in FIG. 9M, the portion 908 of the aperture material layer 302 over the structures 104 is removed to form apertures 105 over regions 108. At operation 817, as shown in FIG. 9N, the patterned etch layer 906 is removed. The method 800C forms the optical device 900C with apertures 105 disposed over regions 108 adjacent to each peripheral structure 106 of the structures 104.

In summation, embodiments described herein relate to methods for fabricating optical devices. The methods described herein enable the fabrication of one or more optical devices on a substrate with apertures surrounding each of the optical devices having a plurality of structures. The apertures are disposed over regions corresponding to one of a space defined by adjacent optical devices and a space defined by one of the optical devices and a periphery of the substrate. The apertures are opaque such that one or more wavelengths are not transmitted. The apertures prevent stray light (i.e., light of an impinging beam being greater than the surface area defined by each peripheral structure of the structures) from degrading the functionality and efficiency of the optical devices.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
    disposing a structure material layer on a surface of a substrate, wherein the structure material layer is disposed between regions of the surface of the substrate corresponding to:
        a first space defined by a first optical device and a second optical device, the first optical device having a first plurality of structures to be formed and the second optical device having a second plurality of structures to be formed; and
        a second space defined by the first optical device and the second optical device and a periphery of the substrate;
    disposing a hardmask over the structure material layer;
    disposing a patterned photoresist corresponding to the pattern of the first plurality of structures and the second plurality of structures over the hardmask, the patterned photoresist defining exposed hardmask portions;
    removing the exposed hardmask portions to expose structure portions of the structure material layer;
    removing the structure portions to form the first plurality of structures of the first optical device and the second plurality of structures of the second optical device between the regions of the surface of the substrate; and
    forming an aperture material over the regions corresponding to the first space and the second space, the aperture material being spaced radially from the first plurality of structures and the second plurality of structures, wherein the aperture material, the first optical device, and the second optical device are positioned above and directly contacting a same horizontal plane across a top surface of the substrate, wherein the first optical device and the second optical device are metasurfaces.

2. The method of claim 1, wherein the forming the aperture material over the regions comprises:
    disposing an encapsulation layer over the first plurality of structures of the first optical device and the second plurality of structures of the second optical device and the regions;
    disposing an aperture material layer over the encapsulation layer;
    disposing a patterned etch layer over the regions to expose a portion of the aperture material layer over the first plurality of structures of the first optical device and the second plurality of structures of the second optical device;
    removing the portion of the aperture material layer over the first plurality of structures of the first optical device and the second plurality of structures of the second optical device; and
    removing the patterned etch layer.

3. The method of claim 2, wherein the encapsulation layer comprises one or more of silicon nitride ($Si_3N_4$), silicon oxide ($SiO_2$), fluoropolymers, hydrogels, and photoresist containing materials.

4. The method of claim 1, wherein the forming the aperture material over the regions comprises masking the first plurality of structures of the first optical device and the second plurality of structures of the second optical device to expose the regions.

5. The method of claim 1, wherein the forming the aperture material over the regions comprises:
    disposing a gap fill material over the first plurality of structures of the first optical device and the second plurality of structures of the second optical device between the regions;
    disposing an aperture material layer over the gap fill material and the regions;
    removing the aperture material layer over the gap fill material; and
    removing the gap fill material.

6. The method of claim 1, wherein the aperture material is formed after removing the structure portions to form the first plurality of structures of the first optical device and the second plurality of structures of the second optical device.

7. The method of claim 1, wherein the forming the aperture material over the regions comprises:
    disposing an encapsulation layer over the first plurality of structures of the first optical device and the second plurality of structures of the second optical device and the regions;
    disposing an aperture material layer over the encapsulation layer;
    disposing a patterned etch layer over portions of the aperture material layer that are disposed between the regions of the surface of the substrate that correspond to the first space and the second space to expose a portion of the aperture material layer over the first plurality of structures of the first optical device and the second plurality of structures of the second optical device;
    removing the portion of the aperture material layer over the first plurality of structures of the first optical device and the second plurality of structures of the second optical device; and
    removing the patterned etch layer.

8. The method of claim 1, wherein the forming the aperture material over the regions comprises:

disposing a gap fill material between the regions of the surface of the substrate that correspond to the first space and the second space to expose the regions;

disposing an aperture material layer over the gap fill material and the regions;

removing the aperture material layer over the gap fill material; and removing the gap fill material.

9. The method of claim 8, wherein the gap fill material is removed by a solvent, wet etching, ashing, reactive ion etching (RIE), or combinations thereof.

10. The method of claim 7, wherein the encapsulation layer is disposed using physical vapor deposition (PVD), chemical vapor deposition (CVD), furnace chemical vapor deposition (FCVD), spin-on coating, or combinations thereof.

* * * * *